United States Patent
Huang et al.

(10) Patent No.: US 9,691,686 B2
(45) Date of Patent: Jun. 27, 2017

(54) CONTACT PAD FOR SEMICONDUCTOR DEVICE

(71) Applicant: Taiwan Semiconductor Manufacturing Company, Ltd., Hsin-Chu (TW)

(72) Inventors: Chang-Chia Huang, Hsin-Chu (TW); Tsung-Shu Lin, New Taipei (TW); Cheng-Chieh Hsieh, Tainan (TW); Wei-Cheng Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/475,169

(22) Filed: Sep. 2, 2014

(65) Prior Publication Data
US 2015/0348877 A1    Dec. 3, 2015

Related U.S. Application Data

(60) Provisional application No. 62/003,979, filed on May 28, 2014.

(51) Int. Cl.
*H01L 23/58* (2006.01)
*H01L 23/48* (2006.01)
(Continued)

(52) U.S. Cl.
CPC ............ *H01L 23/488* (2013.01); *H01L 24/03* (2013.01); *H01L 24/05* (2013.01); *H01L 24/16* (2013.01);
(Continued)

(58) Field of Classification Search
CPC ......... H01L 23/49; H01L 24/11; H01L 23/48; H01L 23/52; H01L 23/31; H01L 29/66; H01L 29/78
(Continued)

(56) References Cited

U.S. PATENT DOCUMENTS 5,969,424 A * 10/1999 Matsuki ............ H01L 23/49816
257/737
6,118,180 A    9/2000 Loo et al.
(Continued)

FOREIGN PATENT DOCUMENTS

| DE | 102009012524 | 10/2009 |
| TW | 200501381 B | 1/2005 |
| TW | 201140792 A | 11/2011 |

*Primary Examiner* — Jessica Manno
*Assistant Examiner* — Sheikh Maruf
(74) *Attorney, Agent, or Firm* — Slater Matsil, LLP

(57) ABSTRACT

A device and method of manufacture is provided that utilize a dummy pad feature adjacent contact pads. The contact pads may be contact pads in an integrated fan-out package in which a molding compound is placed along sidewalls of a die and the contact pads extend over the die and the molding compound. The contact pads are electrically coupled to the die using one or more redistribution layers. The dummy pad features are electrically isolated from the contact pads. In some embodiments, the dummy pad features partially encircle the contact pads and are located in a corner region of the molding compound, a corner region of the die, and/or an interface region between an edge of the die and the molding compound.

20 Claims, 13 Drawing Sheets

(51) Int. Cl.
*H01L 23/52* (2006.01)
*H01L 23/488* (2006.01)
*H01L 23/00* (2006.01)

(52) U.S. Cl.
CPC .............. *H01L 24/19* (2013.01); *H01L 24/81* (2013.01); *H01L 2224/04105* (2013.01); *H01L 2224/05555* (2013.01); *H01L 2224/12105* (2013.01); *H01L 2224/16227* (2013.01); *H01L 2224/73267* (2013.01); *H01L 2224/81805* (2013.01); *H01L 2224/83005* (2013.01); *H01L 2224/92244* (2013.01); *H01L 2225/1035* (2013.01); *H01L 2225/1041* (2013.01); *H01L 2225/1058* (2013.01); *H01L 2924/15311* (2013.01)

(58) Field of Classification Search
USPC ........ 257/668, 212, 737, 777, 676, E21.705, 257/E23.02, 46–88; 438/13
See application file for complete search history.

(56) References Cited

U.S. PATENT DOCUMENTS

| | | | |
|---|---|---|---|
| 6,448,639 B1 * | 9/2002 | Ma ................... | H01L 23/49816 257/698 |
| 6,448,664 B1 * | 9/2002 | Tay ..................... | G01R 1/0408 257/48 |
| 7,026,234 B2 | 4/2006 | Jao et al. | |
| 7,041,513 B2 * | 5/2006 | Akram ................ | G01R 1/0483 257/48 |
| 8,138,014 B2 | 3/2012 | Chi et al. | |
| 2001/0055203 A1 | 12/2001 | Asai et al. | |
| 2002/0180026 A1 * | 12/2002 | Liu ..................... | G01R 31/2884 257/692 |
| 2005/0032353 A1 * | 2/2005 | Cheng ................. | H01L 23/3114 438/624 |
| 2007/0246811 A1 * | 10/2007 | Tsai .................... | H01L 25/105 257/678 |
| 2009/0230535 A1 | 9/2009 | Otremba et al. | |
| 2009/0274418 A1 * | 11/2009 | Holzwarth ............. | B82Y 20/00 385/30 |
| 2010/0006653 A1 * | 1/2010 | Salfelner .......... | G06K 19/07745 235/492 |
| 2010/0133704 A1 * | 6/2010 | Marimuthu .......... | H01L 21/565 257/778 |
| 2010/0238696 A1 * | 9/2010 | Baek ..................... | H01L 24/48 365/51 |
| 2011/0092000 A1 * | 4/2011 | Coffy ................... | G01R 1/0408 438/15 |
| 2011/0254156 A1 * | 10/2011 | Lin ..................... | H01L 21/566 257/737 |
| 2012/0012985 A1 * | 1/2012 | Shen ................... | H01L 23/3171 257/618 |
| 2012/0025368 A1 * | 2/2012 | Lin ..................... | H01L 21/563 257/737 |
| 2012/0286418 A1 * | 11/2012 | Lee ..................... | H01L 21/563 257/737 |
| 2012/0298410 A1 * | 11/2012 | Lu ........................ | H01L 22/32 174/264 |
| 2012/0299167 A1 * | 11/2012 | Chen ................... | H01L 23/3114 257/668 |
| 2013/0093077 A1 * | 4/2013 | Liang ................. | H01L 23/3192 257/737 |
| 2013/0147033 A1 * | 6/2013 | Chen ................... | H01L 23/3114 257/737 |

\* cited by examiner

CONTACT PAD FOR SEMICONDUCTOR DEVICE

PRIORITY CLAIM AND CROSS-REFERENCE

This application claims the benefit of U.S. Provisional Application No. 62/003,979, filed on May 28, 2014, entitled "InFO RDL Routing Capability Improvement Design," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components, such as integrated circuit dies, also require smaller packages that utilize less area than packages of the past, in some applications.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect (PPI) that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
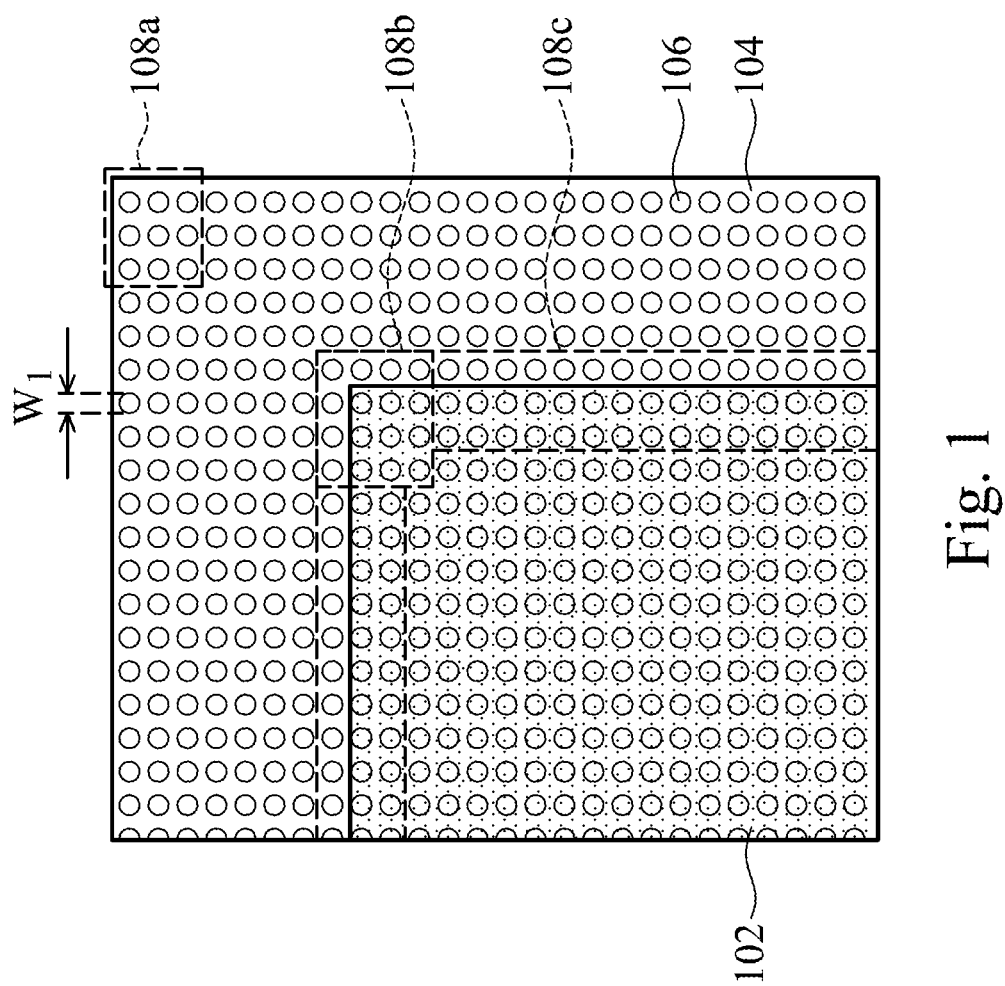
FIG. 1 is a plan view of a portion of an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to packaging devices and methods of manufacture thereof for semiconductor devices. For example, embodiments such as those discussed herein provide a pad structure and arrangement that may be useful in, for example, integrated fan-out (InFO) packages. In some embodiments the pad sizes are decreased to provide additional area for line routing, such as that provided in redistribution layers (RDLs). As such, embodiments such as those disclosed herein extend redistribution layer routing capability by decreasing pad size without additional reliability concern. Large RDL pads typically occupy a high ratio of the area on a single RDL layer, thus routing capability is limited and often require an additional layer or layers to ensure routing integrity, which in turn increases costs. Furthermore, decreasing pad critical dimensions frequently leads to reliability issues on dielectric (e.g., polymer) layers at certain critical locations, such as die-corners of ball grid array configurations. The similar issues have been observed in flip-chip packages as well.

To address these concerns, some embodiments incorporate a dummy pad feature, such as a dummy metal feature, adjacent a contact pad and along an edge of the under-bump metallization (UBM). Generally, as discussed in greater detail below, the dummy pad feature is a feature, such as a metal feature, separated from the pad and partially surrounding the pad. In some embodiments, the dummy pad feature is a dummy ring partially encircling the pad. The dummy pad is not electrically coupled to the contact pad.

The dummy pad feature may be incorporated wherever appropriate for a particular design. For example, in some embodiments the dummy pad feature is provided at die-corners of a ball grid array (BGA) configuration to reduce or eliminate reliability issues, particularly when accompanied by decreasing RDL pad sizes and polymer opening sizes. Additionally, in some embodiments, the dummy pad feature is incorporated in a small area along die-corners and package-corners. For example, in some embodiments, a 3×3 region of a BGA array along die corners and package corners incorporate the dummy pad feature. Dummy pad features may also be incorporated along an interface between the die and a molding compound.

As will be discussed below, embodiments are disclosed that utilize a dummy pad feature and a pad structure for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like.

Referring now to FIG. 1, there is shown a plan view of a portion of an InFO package in accordance with some embodiments. The InFO package illustrated in FIG. 1 includes a die area 102 and a molding compound area 104. In embodiments such as this, a die (represented as the die area 102) has a molding compound (represented by the molding compound area 104) along sidewalls of the die. Contact pads 106 provide an external electrical connection to another substrate, such as a die, wafer, packaging substrate, printed circuit board, interposer or the like. Overlying layers, such as an redistribution layers, under-bump metallization (UBM) layer and the like, are not shown to better illustrate features of an embodiment.

As illustrated in FIG. 1, a width $W_1$ of the contact pads is about 100 μm to about 200 μm, such as about 140 μm. This reduced size of the contact pads, as compared to contact pads having a width of about 240 μm or greater allows greater area for redistribution lines. In some embodiments, the additional area for the redistribution lines allows fewer routing layers to be utilized, thereby reducing the cost of manufacture.

FIG. 1 further illustrates three dummy regions 108a, 108b, and 108c (collectively referred to as dummy regions 108), indicated by the dashed rectangles, represent regions in which the dummy pad features 110 (discussed below with reference to FIG. 2) are incorporated in accordance to some embodiments. The dummy regions 108 illustrate bonding regions that may experience a higher level of stress, for example, during thermal cycling on board (TCoB), such as thermal cycling of a package mounted on a printed circuit board. The incorporation of the dummy pad features 110 reduces the stress and the risk of delamination or other failures.

The first dummy region 108a is along a corner of package. In the embodiment illustrated in FIG. 1, the corner of the package comprises contact pads 106 positioned over the molding compound 104 along the corner. In an embodiment, the first dummy region 108a comprises an area of 3×3 contact pads positioned over the molding compound 104 along a corner of the package, though other sizes may be used. In an embodiment, the second dummy region 108b comprises an area of 4×4 contact pads positioned over a corner of an interface between the die area 102 and the molding compound area 104 along a corner of the die, though other sizes may be used. As illustrated in FIG. 1, the second dummy region 108b may overlap the contact pads in the die area 102 and the molding compound region 104. In an embodiment, the third dummy region 108c comprises an area of 3 contact pads along an interface between the die area 102 and the molding compound area 104 along a edges of the die, though other sizes may be used. As illustrated in FIG. 1, the third dummy region 108c may overlap the contact pads in the die area 102 and the molding compound region 104. Dummy pad features 110, such as those embodiments disclosed herein, may be particularly useful in these regions, or other regions experiencing a higher level of stress, delamination, and/or other failures.

Figure 2:
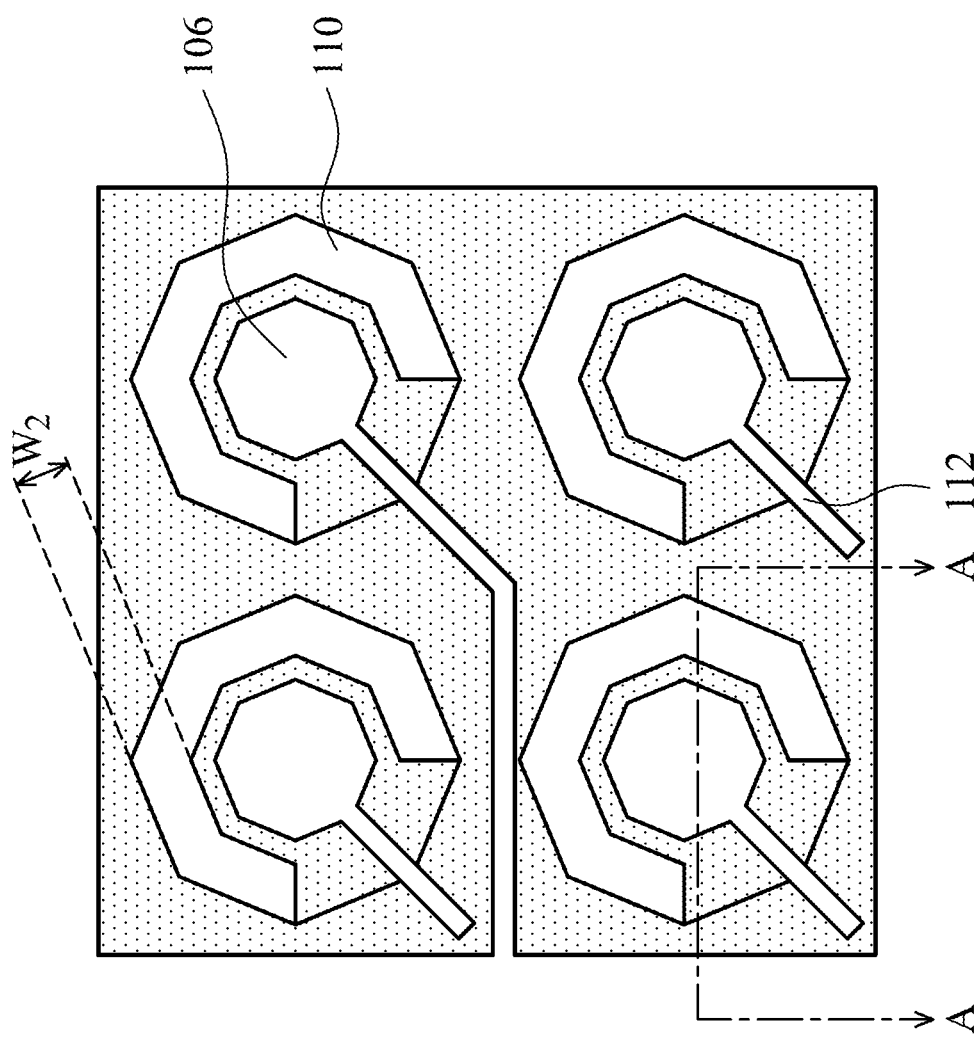
FIG. 2 is a plan view of a contact pad having a dummy pad feature in accordance with some embodiments.

FIG. 2 illustrates an enlarged plan view of the contact pads 106 and dummy pad features 110 in accordance with some embodiments. FIG. 2 also illustrates part of portions of a redistribution layer 112. The redistribution layer 112 is a conductive line that routes the electrical signals to the desired location of the contact pads 106. In the embodiment illustrated in FIG. 2, the dummy pad features 110 form rings partially encircling the contact pads 106. In some embodiments, the dummy pad features 110 are on an opposing side of the contact pad 106 from the die or a die center.

In some embodiments, a width $W_2$ of the dummy pad features is about 15 μm to about 30 μm, such as about 20 μm. A width of the dummy pad features may be adjusted according to the needs of a particular design and pad layout. In some embodiments a width of 15 μm or greater provided significant reductions in the stress and cracking issues, particularly within the polymer regions around the contact pads. Further, in some embodiments, a width of greater than about 30 μm provided little or no additional advantage and in some embodiments may require additional space. Other embodiments may utilize other dimensions.

Figure 3A:
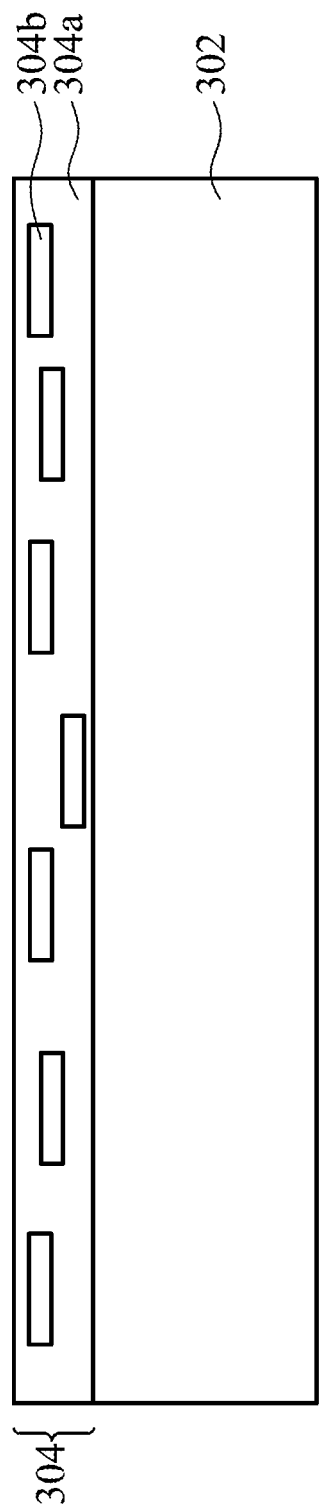
FIGS. 3A-3J illustrate various intermediate process steps in manufacturing a package having a contact pad in accordance with some embodiments.

FIGS. 3A through 3J illustrate various cross-sectional views of intermediate steps of manufacturing a semiconductor device such as that discussed above with reference to FIGS. 1 and 2 in accordance with some embodiments. Referring first to FIG. 3A, there is shown a carrier substrate 302 having one or more optional backside redistribution layers 304 formed thereon. As will be discussed in greater detail below, a die will be placed on the carrier substrate 302 having the contact pads face up. The backside redistribution layers 304 provide for electrical connections on both sides of the package, allowing for stacked package (e.g., package-on-package (POP) configurations). Alternatively, the backside redistribution layers 304 may be omitted if a die, package, or other substrate will not be stacked upon the current package.

Generally, the carrier substrate 302 provides temporary mechanical and structural support during subsequent processing steps. Additionally, as illustrated in FIG. 3A, the carrier substrate 302 provides a surface on which to form the backside redistribution layers 304. The carrier substrate 302 may comprise, for example, glass, silicon oxide, aluminum oxide, and the like.

The backside redistribution layers 304 include one or more layers of dielectric materials with conductive features (e.g., conductive lines and vias) formed therein. The one or more layers of dielectric materials are represented collectively as backside dielectric layers 304a, and the conductive features are collectively represented as backside conductive features 304b.

The one or more backside dielectric layers 304a may be formed of any suitable material (e.g., polyimide (PI), polybenzoxazole (PBO), BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like). The formation of the backside conductive features 304b may include patterning the backside dielectric layers 304a (e.g., using photolithography and/or etching processes) and forming backside conductive features 304b in the patterned backside dielectric layers 304a (e.g., by depositing a seed layer, using a mask layer to define the shape of the conductive features, and using an electroless/electrochemical plating process).

Figure 3B:
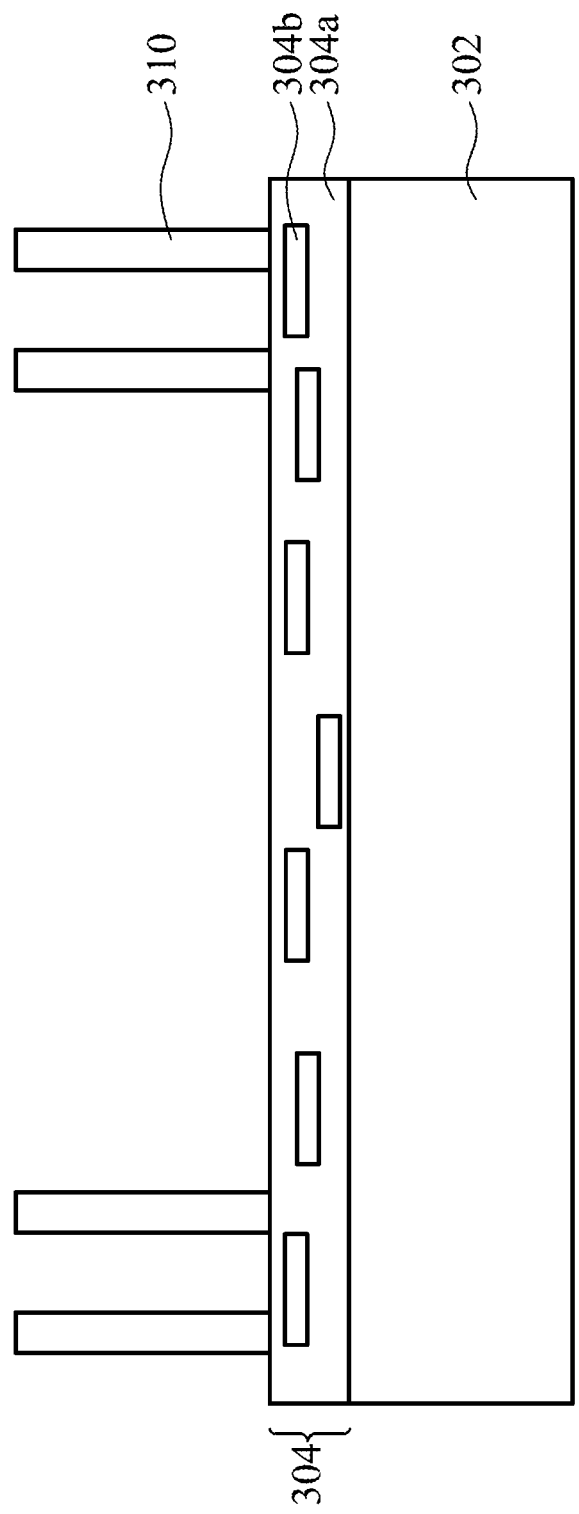

FIG. 3B illustrates formation of optional through vias 310 in accordance with some embodiments. The optional through vias 310 provide an electrical connection from one side of the package to another side of the package. For example, as will be explained in greater detail below, a die will be mounted to the backside redistribution layers 304 and a molding compound will be formed around the through vias and the die. Subsequently, another device, such as another die, package, substrate, or the like, may be attached to the die and the molding compound. The through vias 310 provide an electrical connection between the another device and the backside redistribution layers 304 without having to pass electrical signals through the die mounted to the backside redistribution layers 304.

The through vias 310 may be formed, for example, by forming a conductive seed layer (not shown) over the backside redistribution layers 304. A mask, such as a patterned photoresist layer, may be deposited and patterned to define the shape of the through vias 310, wherein openings in the mask expose the seed layer. The openings may be filled with a conductive material using, for example, an electroless plating process or an electrochemical plating process. The plating process may uni-directionally fill openings (e.g., from seed layer upwards) in the patterned photoresist. Uni-directional filling may allow for more uniform filling of such openings, particularly for high aspect ratio through vias. Alternatively, a seed layer may be formed on sidewalls of openings in the patterned photoresist, and such openings may be filled multi-directionally. Subsequently, the photoresist may be removed in an ashing and/or wet strip process, leaving the through vias 310 over and electrically connected to backside redistribution layers 304 as illustrated in FIG. 3B. The through vias 310 can also be realized with metal wire studs placed by a wire bonding process, such as a copper wire bonding process. The use of a wire bonding process may eliminate the need for depositing a seed layer, depositing and patterning a photoresist, and plating to form the through vias 310.

Figure 3C:
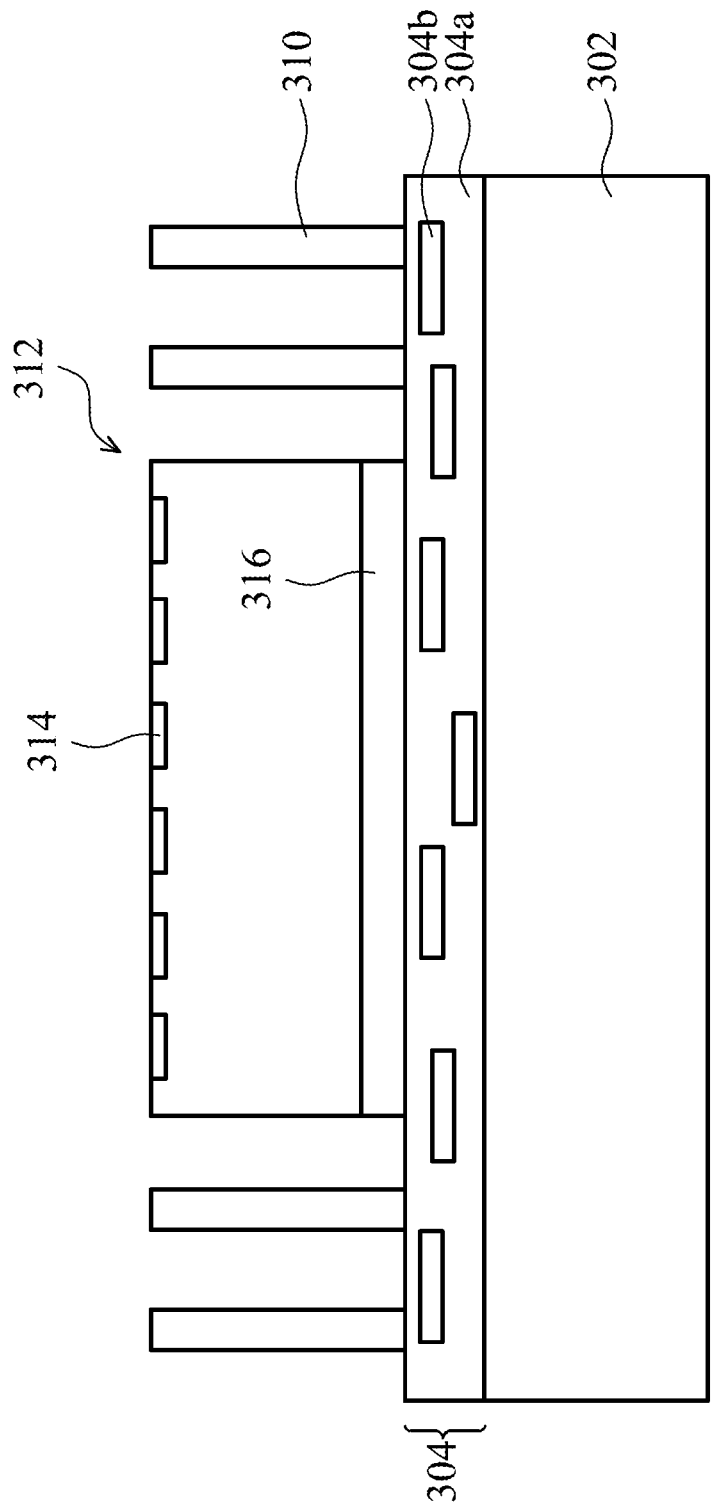

Referring now to FIG. 3C, there is shown a die 312 attached to the backside redistribution layers 304 in accordance with some embodiments. The die 312 may include a substrate having any type of circuitry suitable for a particular application formed thereon. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The die 312 may include one or more dielectric layers overlying the electrical devices, and metal layers may be formed between dielectric layers to route electrical signals between the electrical devices. Electrical devices may also be formed in one or more dielectric layers. The die 312 includes external contacts, such as contacts 314, in the uppermost dielectric layer to provide external electrical connections to the electrical circuitry. In an embodiment, the contacts 314 are aluminum pads or aluminum-copper pads, although other metallic materials may be used. The contacts 314 may be pads, pillars, solder balls, wire studs, or other conductive electrical connection to the electrical circuitry of the die 312.

The die 312 may be attached to the backside redistribution layer 304 using, for example, an adhesive layer 316 (e.g., a die attach film (DAF)) disposed on a back surface. In an embodiment, the adhesive layer 316 may be any suitable adhesive, such as an ultraviolet (UV) glue, which loses its adhesive property when exposed to UV lights.

Figure 3D:
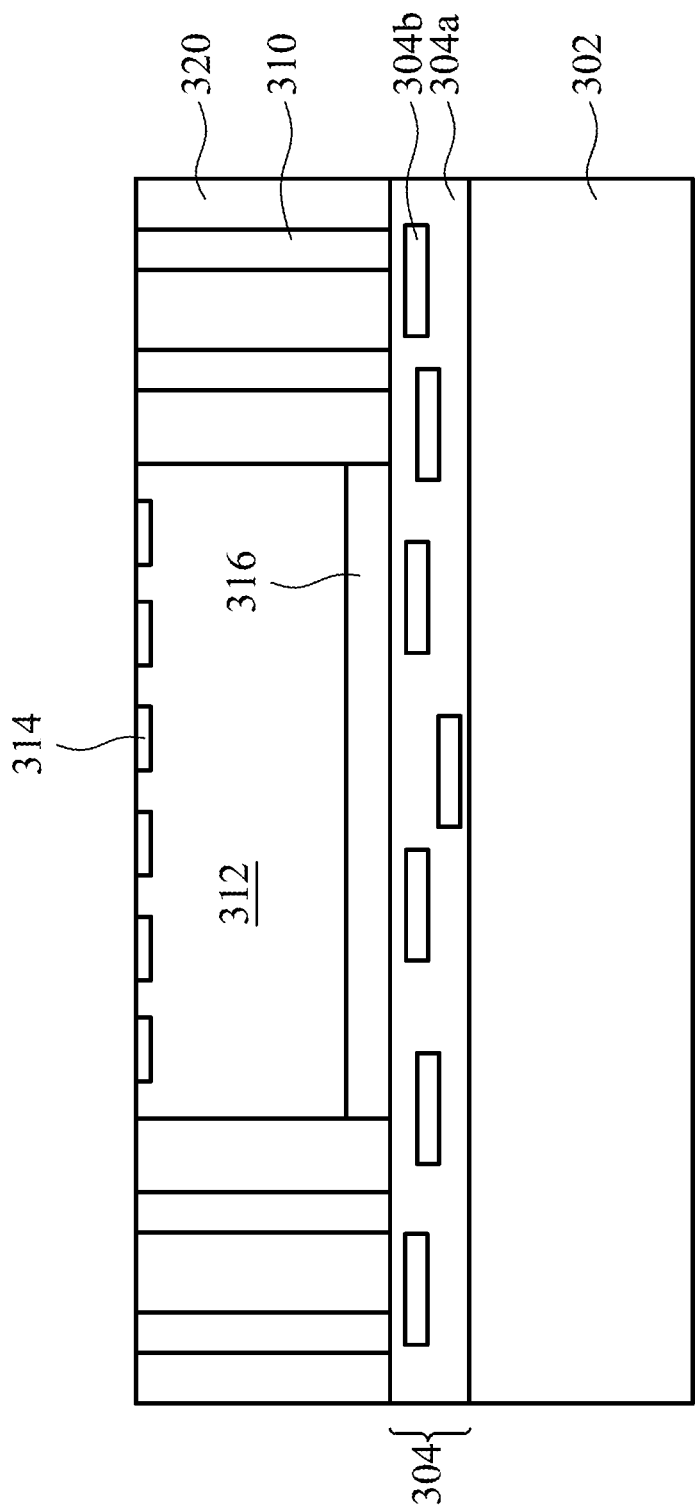

FIG. 3D illustrates a molding process and molding grind back in accordance with some embodiments. In some embodiments, the molding process is a wafer-level molding process. For example, molding compound 320 is dispensed to fill gaps between the die 312 and the through vias 310. The molding compound 320 may include any suitable material such as an epoxy resin, a molding underfill, and the like. Suitable methods for forming the molding compound 320 may include compressive molding, transfer molding, liquid encapsulant molding, and the like. For example, the molding compound 320 may be dispensed between the die 312 and the through vias 310 in liquid form. Subsequently, a curing process is performed to solidify the molding compound 320. The filling of the molding compound 320 may overflow the die 312 and the through vias 310 so that the molding compound 320 covers top surfaces of the die 312 and the through vias 310. A mechanical grinding, chemical mechanical polish (CMP), or other etch back technique may be employed to remove excess portions of the molding compound 320 and expose the contacts 314 of the die 312. After planarization, top surfaces of the molding compound 320, the die 312, and the through vias 310 may be substantially level.

Figure 3E:
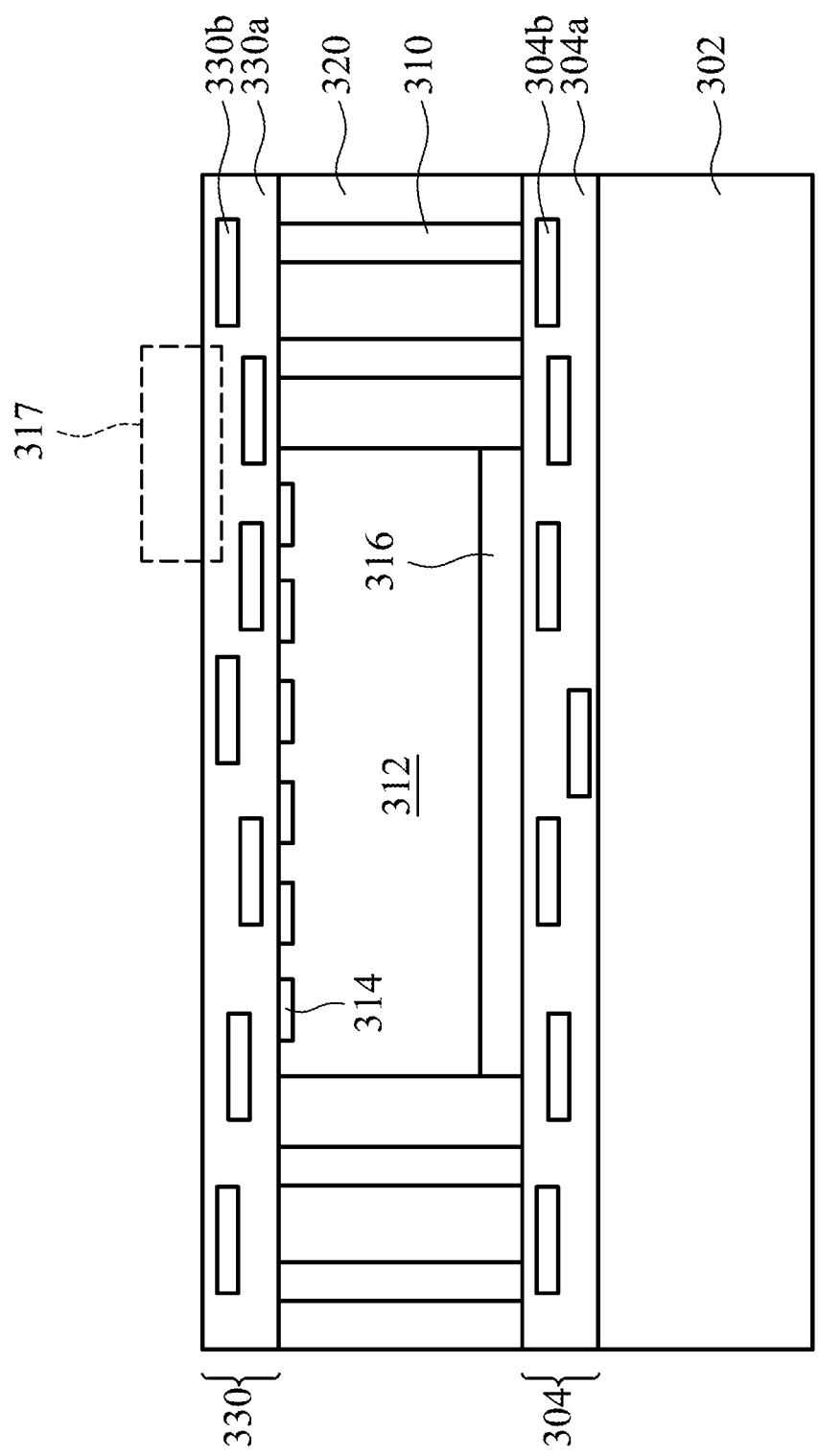

Referring next to FIG. 3E, there is shown one or more front side redistribution layers 330 in accordance with some embodiments. The front side redistribution layers 330 may be substantially similar to the backside redistribution layers 304 both in formation process and composition. For example, the front side redistribution layers 330 may include one or more layers of dielectric materials (e.g., dielectric layers 330a) with conductive features (e.g., conductive lines and vias 330b) formed therein. The one or more dielectric layers may be formed of any suitable material (e.g., polyimide (PI), polybenzoxazole (PBO), BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like). The formation of the front side redistribution layers 330 may include patterning the dielectric layers using, for example, photolithography and/or etching processes, and forming conductive features in the patterned dielectric layers by, for example, forming a conductive material in the openings of the patterned dielectric layers.

Figure 3F:
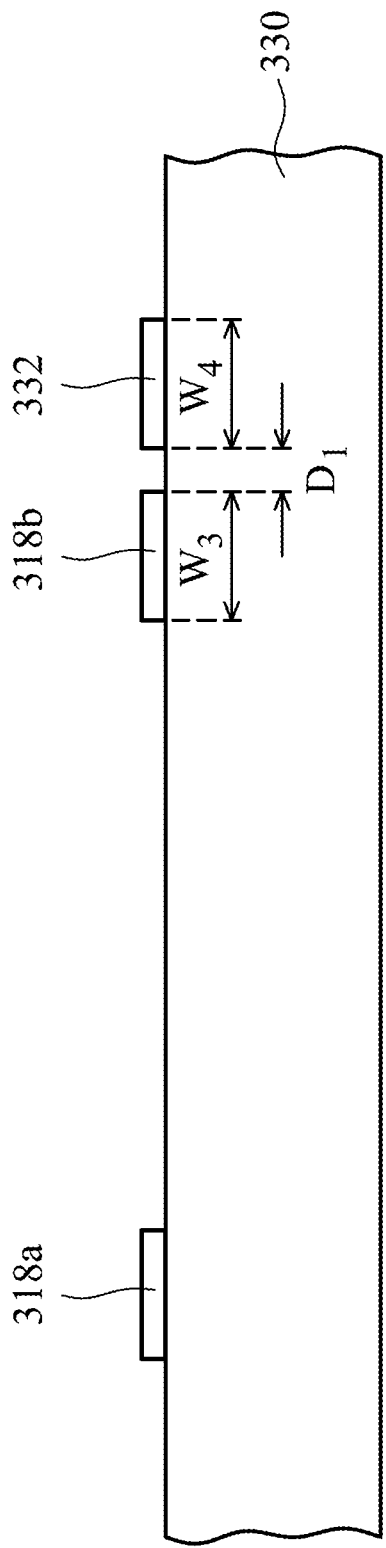

FIG. 3F illustrates an enlarged view of a reference area 317 identified in FIG. 3E by the dotted rectangle. As shown in FIG. 3E, the reference area 317 includes a region corresponding to the third dummy region 108c and an area adjacent to the third dummy region 108c as discussed above with reference to FIG. 1. FIG. 3F illustrates two contact pads 318a and 318b (collectively referred to as contact pads 318) for purposes of illustration, wherein a first contact pad 318a is outside the third dummy region 108c and a second contact pad 318b is within the third dummy region 108c. It is understood that many more contact pads may be present and that similar processes and materials may be used in other areas of the bonding area, such as the first dummy region 108a and the second dummy region 108b discussed above with reference to FIG. 1.

Referring back to FIG. 3F, there are shown two contact pads 318a and 318b, both of which may be used to provide an electrical contact. Also shown in FIG. 3F is a dummy pad feature 332 formed adjacent to the contact pad 318b. For reference, formation of the contact pad 318b and the dummy pad feature 332 is illustrated along the A-A line of FIG. 2.

The contact pads 318 and the dummy pad feature 332 may be formed of any suitable process and any suitable materials. For example, in an embodiment a seed layer (not shown) is deposited over a surface of the front side redistribution layers 330. Thereafter, a patterned mask layer, such as a photoresist layer that has been deposited, exposed, and developed, is formed over the seed layer having openings defining the desired shape of the contact pads 318 and the dummy pad feature 332. It is understood that the openings may further define a redistribution line to route the contact pads to the desired location, such as that illustrated in FIG. 2. A plating process may be used to form the contact pads 318 and the dummy pad feature 332 over the seed layer within the openings of the patterned mask layer. For example, an electroless plating process or an electrochemical plating process may be used. Thereafter, the patterned mask layer may be removed, and exposed portions of the seed layer may be removed using the contact pads and the dummy pad feature 332 as a mask. In some embodiments, the contact pads 318 and the dummy pad feature 332 are aluminum pads or aluminum-copper pads, although other metallic materials may be used.

As illustrated in FIG. 3F, the contact pads 318 have a width $W_3$ of about 100 µm to about 200 µm, and the dummy pad feature 332 has a width $W_4$ of about 15 µm to about 30 µm. In some embodiments, the dummy pad feature 332 is spaced apart from the contact pad 318b by a distance $D_1$. The distance $D_1$ may be sized in order to maintain an overlap between the dummy pad feature 332 and a subsequently formed under bump metallization (discussed in greater detail below). In some embodiments, the dummy pad feature 332 may have a thickness of about 2 µm to about 10 µm. It has been found that dimensions such as these reduce stress while allowing for a smaller pad size. The dummy pad feature 332 may also act as a crack stopper.

It is understood that the contact pads 318 provide an electrical connection between another substrate to be subsequently attached (see, e.g., FIG. 3I) and the die 102 and/or the through vias 310. On the other hand, the dummy pad features 332 provide no electrical connectivity and are not components in the electrical circuitry. As illustrated in FIG. 3F, the contact pads 318 are separated from the dummy pad features 332. As such, the dummy pad features 332 are features added to reduce stress and provide no electrical connectivity.

Figure 3G:
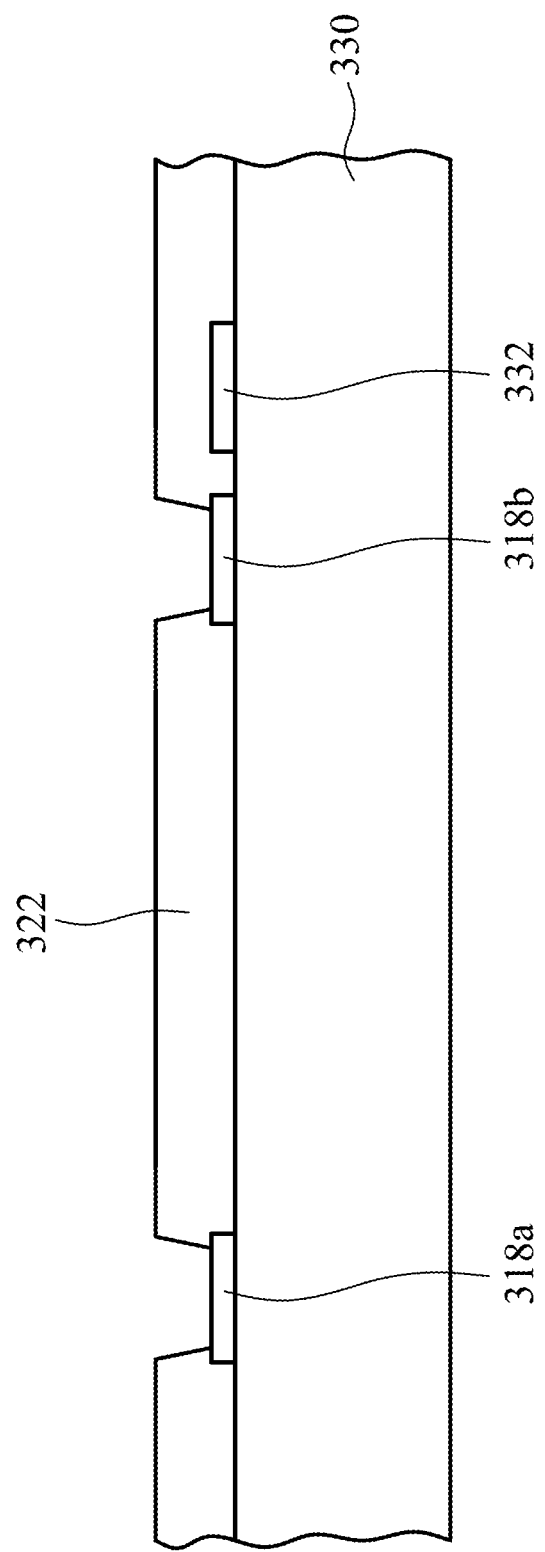

FIG. 3G illustrates one or more protective layers 322 formed over front side redistribution layers 330 in accordance with some embodiments. Protective layers 322 may be formed of a polymer such as an epoxy, polyimide, benzocyclobutene (BCB), polybenzoxazole (PBO), and the like. The formation methods may include spin coating, for example. The protective layers 322 are patterned to form an opening, through which the contact pads 318 are exposed. The patterning of protective layers 322 may include photolithography techniques. A curing step may be performed to cure the protective layers 322.

Figure 3H:
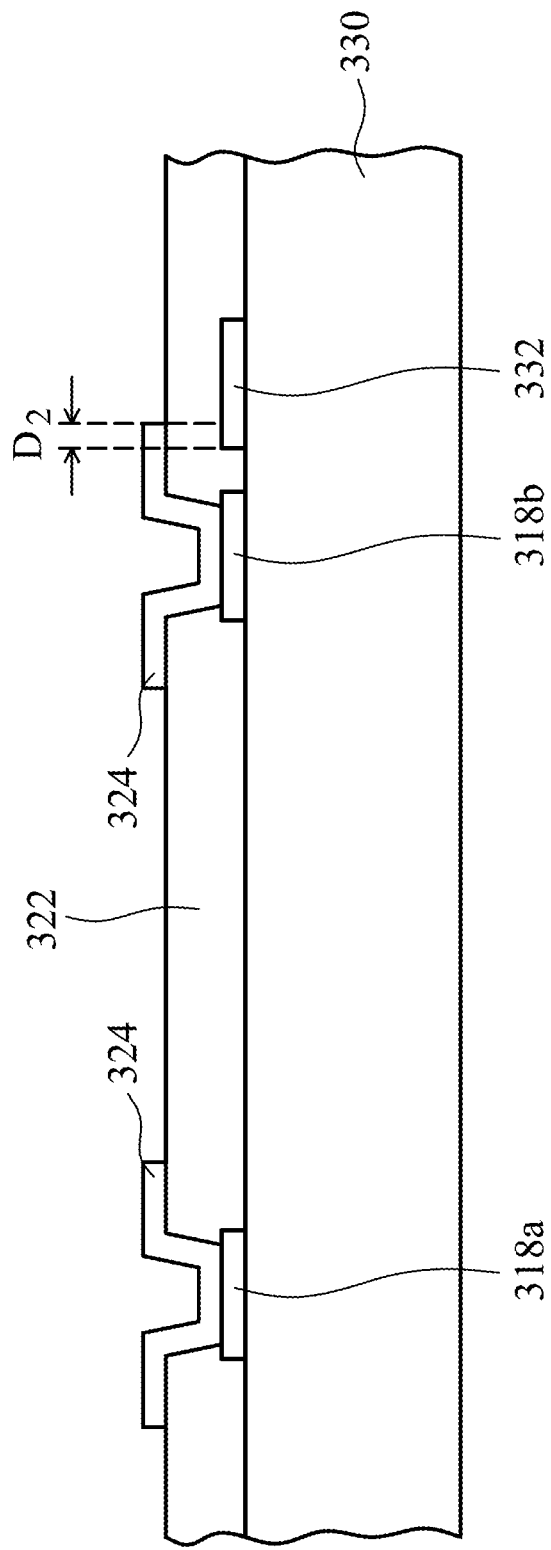

FIG. 3H illustrates an under bump metallization (UBM) 324 formed and patterned over the one or more protective layers 322 and extends through the one or more protective layers 322, thereby forming an electrical connection with the contact pads 318. The under bump metallization 324 provides an electrical connection upon which an electrical connector, e.g., a solder ball/bump, may be placed. In an embodiment, the under bump metallization 324 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 324 is formed using sputtering. In other embodiments, electro plating may be used.

In some embodiments, the under bump metallization 324 laterally overlaps the dummy pad features as illustrated in FIG. 3H. In some embodiments, the under bump metallization 324 laterally overlaps the dummy pad features by a distance $D_2$ of greater than about 7.5 µm. For example, in some embodiments in which the width of the dummy pad features is about 15 µm, the under bump metallization overlaps about 50% of the dummy pad features. Overlapping the under bump metallization 324 and the dummy pad features help reduce the stress further, including stress within the polymer layer at the under bump metallization edge, such as the stresses caused during temperature cycles. In some embodiments, the stress is reduced by about 30%.

Figure 3I:
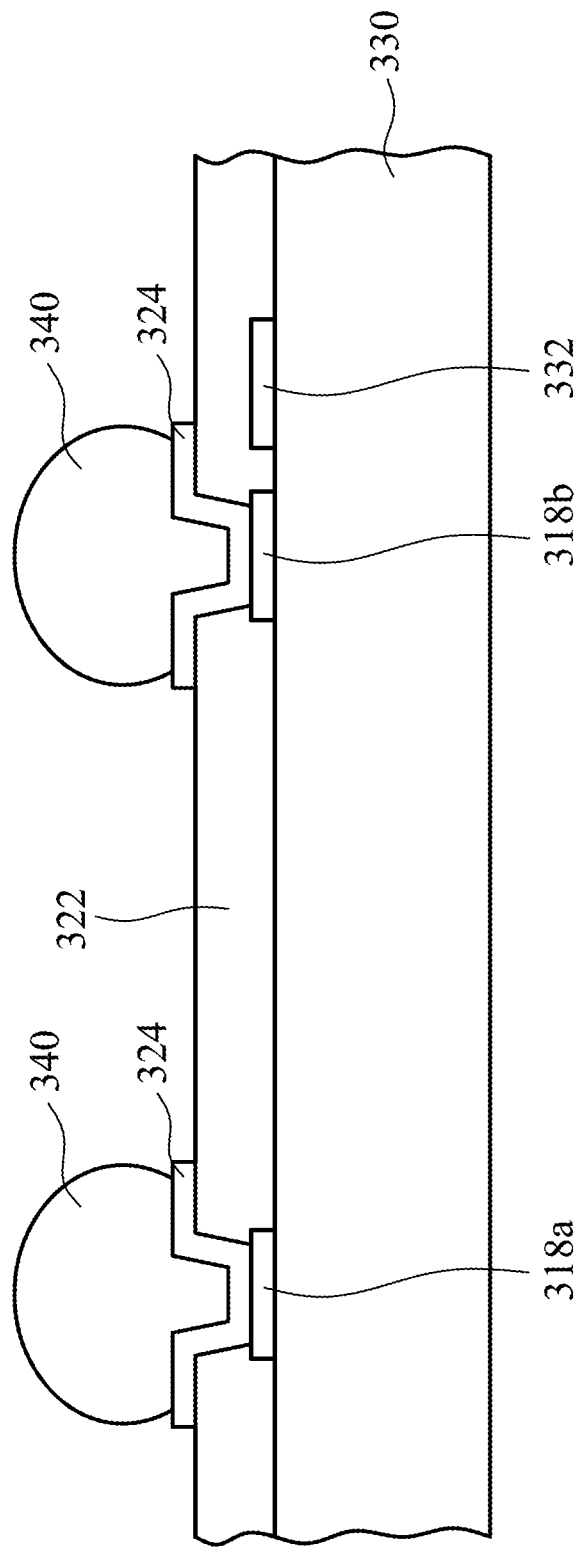

Referring next to FIG. 3I, a connector 340 is formed over the under bump metallization 324 in accordance with some embodiments. In an embodiment, the connector 340 comprises a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 340 may be one among an array of the connectors formed as a grid, such as a ball grid array (BGA). The connector 340 comprises a conductive ball having a shape of a partial sphere in some embodiments. Alternatively, the connector 340 may comprise other shapes. The connector 340 may also comprise non-spherical conductive connectors, for example.

The connector 340 is attached in some embodiments using a solder ball drop process. During the connector 340 mounting process, or after the conductive material mounting process, the eutectic material of the conductive material 340 may be re-flowed.

Figure 3J:
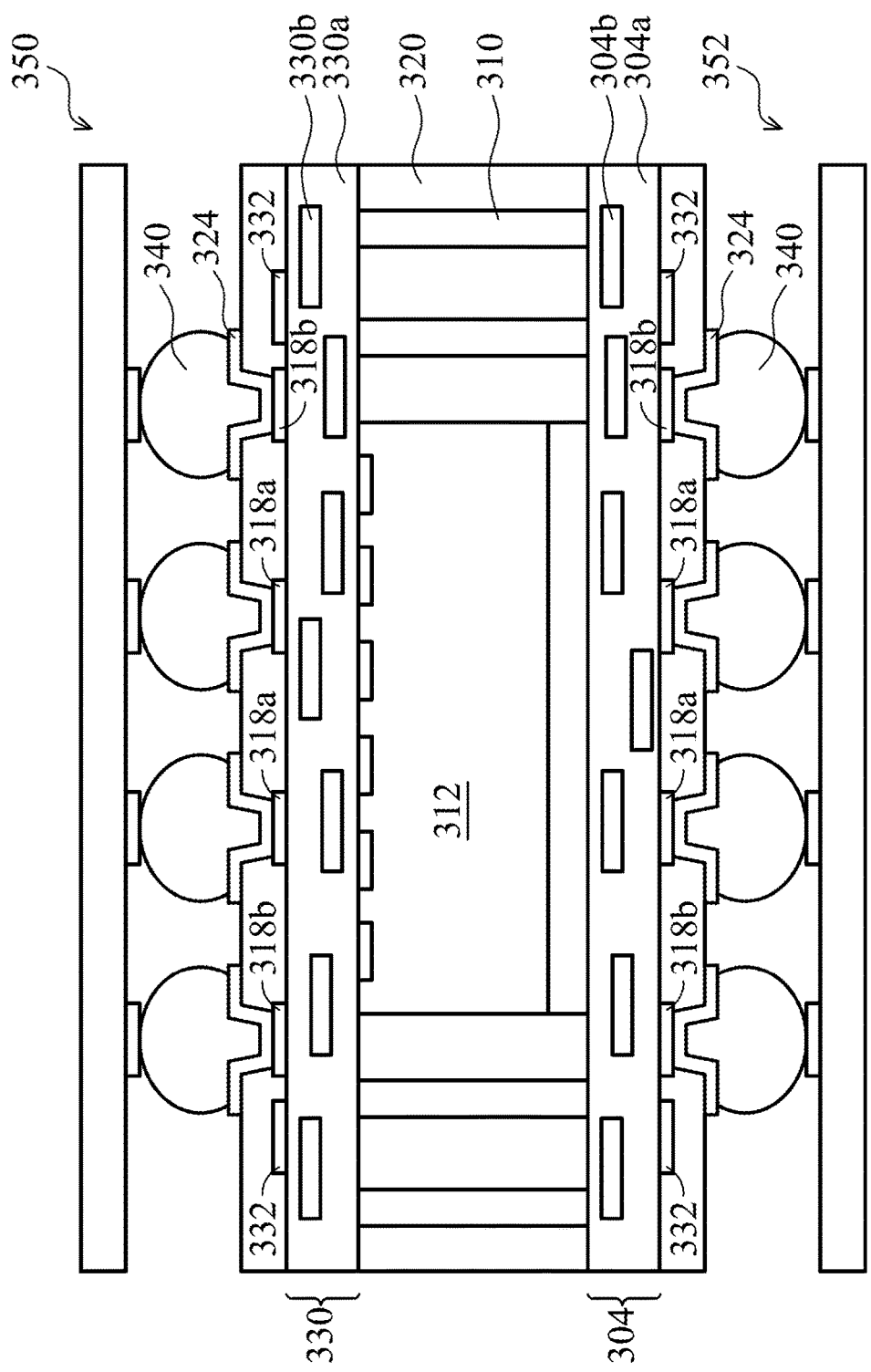

FIG. 3J illustrates removal of the carrier substrate 302 and attachment of an upper substrate 350 and a lower substrate 352 in accordance with an embodiment. Each of the upper substrate 350 and the lower substrate 352 may be a die, wafer, packaging substrate, motherboard, printed circuit board, or the like. In some embodiments, a package-on-package structure is formed. For example, the upper substrate 350 may be another package, wherein the die 312 is a processor and the upper substrate 350 is a package providing memory. In this embodiment, the lower substrate 352 may be a printed circuit board or a packaging substrate.

As illustrated in FIG. 3H, in some embodiments the dummy pad features (e.g., the dummy pad feature 332) are not exposed. Due to differences in the coefficient of thermal expansion (CTE) between the upper substrate 350 and the other components, stresses between the connector 340 and the contact pads 318 may cause delamination or other undesirable issues. As noted above, the stress at the contact pads 318 increases as the size of the contact pads decrease, which in turn may cause delamination or other failures. This stress may be particularly high in the dummy regions 108, e.g., along the corners of the package and along the interface between the die 312 and the molding compound 320.

The dummy pad features 332 provide stress relief, reducing the stress applied to the contact pads 318. The addition of the dummy pad features 332 allows for the contact pads to be reduced in size, thereby allowing for increase area for routing interconnect lines. This increased routing area may allow fewer layers to be required, thereby reducing costs.

As illustrated in FIG. 3J, the dummy pad features 332 may also be incorporated on the backside redistribution layers 304.

Embodiments such as those discussed above were presented in terms of a fan-out packaging with backside and front side redistribution layers for illustrative purposes. Other embodiments may utilize the disclosed features in other configurations. For example, the backside redistribution layers, the through vias, and the like may not be present in all embodiments. Furthermore, embodiments may not utilize a fan-out configuration. In yet other embodiments, the dummy pad features may be utilized on the backside redistribution layers as well as the front side redistribution layers. Additionally, a single redistribution layer may be utilized in one or both of the backside and front side redistribution layers.

Figure 4:
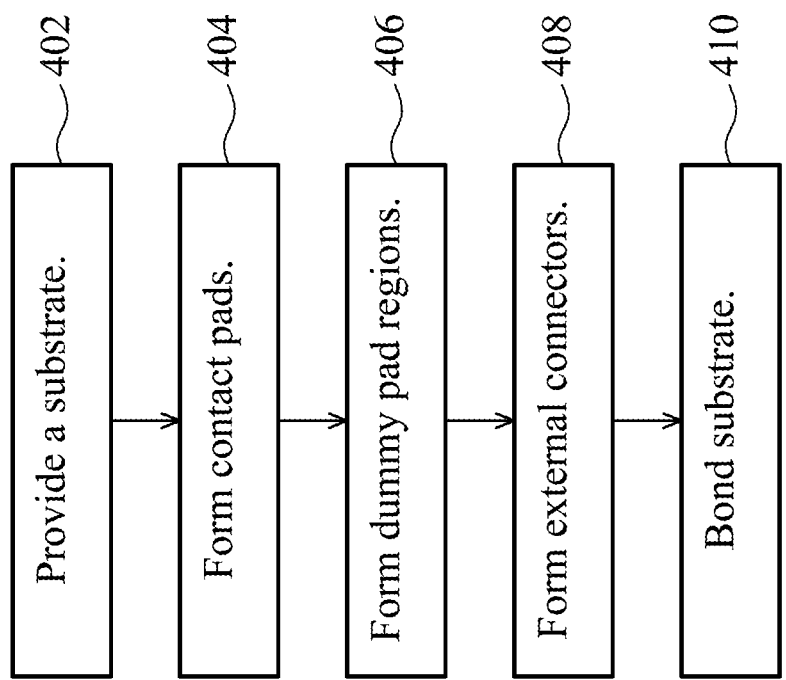
FIG. 4 is a flow diagram illustrating steps that may be performed to manufacture a device in accordance with some embodiments.

FIG. 4 is a flow chart illustrating steps of a process of forming a device in accordance with some embodiments. The process begins in step 402, wherein a substrate is provided. In some embodiments, the substrate is an integrated fan-out package as discussed above with reference to FIGS. 3A-3E, although other types of substrates may be used. In step 404, contact pads are formed on the substrate and in step 406 dummy pad regions are formed, as discussed above with reference to FIG. 3F. In some embodiments, the contact pads and the dummy pads may be formed simultaneously. The dummy pad regions may be formed in high stress regions as discussed above, thereby providing additional wiring routing area. In step 408, external connectors are formed, such as that discussed above with reference to FIGS. 3G-3I. Passivation layers and under-bump metallization layers may also be formed. Thereafter, in step 410, the structure may be bonded to another substrate, such as discussed above with reference to FIG. 3J.

In an embodiment, a method is provided. The method includes providing a substrate and forming contact pads on the substrate. The contact pads provide electrical connections to circuitry on the substrate. A dummy pad feature is formed adjacent a first contact pad such that the dummy pad feature is completely over the dielectric surface and provides no electrical connectivity. An external electrical connector is formed on the first contact pad.

In another embodiment, another method in provided. The method includes providing a die and forming a molding compound along sidewalls of the die. Contact pads are formed over the die and the molding compound. Dummy pad features are formed adjacent a subset of the contact pads, wherein the dummy pad features are electrically isolated from the contact pads. Electrical connectors are formed on the contact pads, and a substrate is attached to the electrical connectors.

In yet another embodiment, a device is provided. The device includes a die and a molding compound along sidewalls of the die. Contact pads are over the die and the molding compound. Dummy pad features are adjacent select ones of the contact pads, wherein the dummy pad features provide no electrical connectivity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming contact pads on substrate, the contact pads including a first contact pad, the contact pads providing electrical connections to circuitry on the substrate;
    forming a dummy pad feature adjacent the first contact pad, the dummy pad feature not being electrically connected to electrical circuitry, the dummy pad feature being a single continuous conductive element having a concave opening, the first contact pad being within the concave opening; and
    forming an external electrical connector on the first contact pad.

2. The method of claim 1, wherein the external electrical connector comprises a solder ball.

3. The method of claim 1, wherein the dummy pad feature comprises a metal.

4. The method of claim 1, wherein the first contact pad and the dummy pad feature are formed over a molding compound in a corner of a package.

5. The method of claim 1, wherein the first contact pad and the dummy pad feature are formed over an interface region between a die and a molding compound.

6. The method of claim 1, wherein the dummy pad feature is positioned on a side of the contact pad opposite a center of a die.

7. A method comprising:
    forming a molding compound along sidewalls of a die;
    forming contact pads over the die and the molding compound;
    forming dummy pad features adjacent a subset of the contact pads, the dummy pad features being electrically isolated from the contact pads, at least one of the dummy pad features being a single continuous conductive element extending on opposing sides of a conductive line coupled to the at least of the dummy pad features;
    forming electrical connectors on the contact pads; and
    attaching a substrate to the electrical connectors.

8. The method of claim 7, wherein the dummy pad features are positioned in a corner region of the molding compound.

9. The method of claim 7, wherein the dummy pad features are positioned in a corner region of the die.

10. The method of claim 7, wherein the dummy pad features are positioned in an interface region between the die and the molding compound along edges of the die.

11. The method of claim 7, wherein the dummy pad features are formed of a same material as the contact pads.

12. The method of claim 7, wherein each of the dummy pad features form a ring partially encircling a corresponding one of the contact pads.

13. A method comprising:
  forming a molding compound along sidewalls of a die;
  forming one or more redistribution layers over the die and the molding compound;
  forming a plurality of contact pads over the one or more redistribution layers, a first subset of the plurality of contact pads being in a first region and a second subset of the plurality of contact pads being in a second region; and
  forming dummy pad features adjacent the first subset of the plurality of contact pads, the second subset of the plurality of contact pads being free of the dummy pad features, the dummy pad features being electrically isolated from the first subset of the plurality of contact pads, each of the dummy pad features being a single continuous conductive element extending along opposing sides of respective ones of the plurality of contact pads.

14. The method of claim 13, wherein the first region is closer to an interface of the die and the molding compound than the second region.

15. The method of claim 13, wherein the first region is above a corner of the die.

16. The method of claim 13, wherein the first region is above a corner of the molding compound.

17. The method of claim 13, wherein the second region is positioned between an edge of the die and an edge of the molding compound in a plan view.

18. The method of claim 13, wherein the dummy pad features are positioned on a side of respective contact pads opposite a center of a die.

19. The method of claim 13, wherein the plurality of contact pads and the dummy pad features are formed simultaneously.

20. The method of claim 1, wherein the dummy pad feature has a width between 15 μm and 30 μm.

* * * * *

UNITED STATES PATENT AND TRADEMARK OFFICE
CERTIFICATE OF CORRECTION

PATENT NO. : 9,691,686 B2
APPLICATION NO. : 14/475169
DATED : June 27, 2017
INVENTOR(S) : Chang-Chia Huang Page 1 of 1

It is certified that error appears in the above-identified patent and that said Letters Patent is hereby corrected as shown below:

In the Claims

In Column 10, Line 59, Claim 7, delete "at least of" and insert --at least one of--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*